(12) United States Patent
Kugo et al.

(10) Patent No.: US 9,087,976 B2
(45) Date of Patent: Jul. 21, 2015

(54) ULTRASONIC-MOTOR-DRIVING DEVICE AND ULTRASONIC MOTOR UNIT

(75) Inventors: Kouichi Kugo, Daito (JP); Kenshou Miyatake, Daito (JP); Hirono Tsubota, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 301 days.

(21) Appl. No.: 13/701,388

(22) PCT Filed: May 16, 2011

(86) PCT No.: PCT/JP2011/061143
§ 371 (c)(1),
(2), (4) Date: Nov. 30, 2012

(87) PCT Pub. No.: WO2011/152191
PCT Pub. Date: Dec. 8, 2011

(65) Prior Publication Data
US 2013/0069563 A1  Mar. 21, 2013

(30) Foreign Application Priority Data
Jun. 2, 2010 (JP) .................. 2010-126421

(51) Int. Cl.
*H02N 2/00* (2006.01)
*H01L 41/00* (2013.01)
*H01L 41/04* (2006.01)
*H02N 2/14* (2006.01)

(52) U.S. Cl.
CPC .............. *H01L 41/042* (2013.01); *H02N 2/142* (2013.01)

(58) Field of Classification Search
USPC .......................................... 318/116; 310/311
See application file for complete search history.

(56) References Cited

U.S. PATENT DOCUMENTS

| 3,975,650 | A | * | 8/1976 | Payne ...................... 310/316.01 |
| 4,081,706 | A | * | 3/1978 | Edelson ................... 310/316.01 |
| 4,933,918 | A | * | 6/1990 | Landsrath et al. ............ 367/139 |
| 5,720,710 | A | * | 2/1998 | Tachibana et al. ................ 601/2 |
| 2007/0040871 | A1 | | 2/2007 | Urano |

FOREIGN PATENT DOCUMENTS

| CN | 101345493 A | 1/2009 |
| JP | 2-184277 A | 7/1990 |
| JP | 6-339289 A | 12/1994 |
| JP | 2828222 B2 | 11/1998 |
| JP | 2006-314161 A | 11/2006 |
| JP | 2007-89384 A | 4/2007 |
| JP | 2008-301563 A | 12/2008 |
| JP | 2009-284635 A | 12/2009 |

OTHER PUBLICATIONS

International Search Report dated Jul. 19, 2011 including English-language translation (Five (5) pages).
Japanese-language Written Opinion (PCT/ISA/237) dated Jul. 19, 2011 (Three (3) pages).

* cited by examiner

*Primary Examiner* — Bentsu Ro
(74) *Attorney, Agent, or Firm* — Crowell & Moring LLP (57) ABSTRACT

An ultrasonic-motor-driving device is provided which allows fine adjustment of the periods of driving waves that are generated by a driving-wave-generating portion. A driving device for an ultrasonic motor includes a driving-wave-generating portion. The driving-wave-generating portion generates signals for driving piezoelectric elements included in the ultrasonic motor. The driving-wave-generating portion is constructed capable of generating rectangular waves including a plurality of rectangular waves with different periods.

20 Claims, 4 Drawing Sheets

FIRST EMBODIMENT

| CASE | 85.9(kHz) | 85.1(kHz) | Ave. (kHz) |
|------|-----------|-----------|------------|
| 1    | ONE       | ONE       | 85.5       |
| 2    | ONE       | THREE     | 85.3       |
| 3    | ONE       | FOUR      | 85.26      |
| 4    | ONE       | NINE      | 85.18      |

ULTRASONIC-MOTOR-DRIVING DEVICE AND ULTRASONIC MOTOR UNIT

TECHNICAL FIELD

The present invention relates to an ultrasonic-motor-driving device and an ultrasonic motor unit, and more particularly to an ultrasonic-motor-driving device and an ultrasonic motor unit including a driving-wave-generating portion.

BACKGROUND ART

In general, a driving device for an ultrasonic motor including a driving-wave-generating portion is known. For example, Japanese Patent Laying-Open No. 2008-301563 discloses this type of driving device for an ultrasonic motor.

The driving device for the ultrasonic motor in Japanese Patent Laying-Open No. 2008-301563 is constructed to apply rectangular waves (voltages) that are generated by a rectangular-wave-generating circuit (driving-wave-generating portion) to the ultrasonic motor through a low pass filter, an amplifier, and the like. In addition, the rectangular-wave-generating circuit is constructed to generate rectangular waves with a desired period in response to the instructions from a control portion. In addition, it is considered that the period of the rectangular wave generated by the rectangular-wave-generating circuit is adjusted based on the time period of one clock of a clock in the control portion as a time period unit.

PRIOR ART

Patent Document

Patent Document 1: Japanese Patent Laying-Open No. 2008-301563

SUMMARY OF THE INVENTION

Problems to be Solved by the Invention

However, in the ultrasonic motor disclosed in Japanese Patent Laying-Open No. 2008-301563, there is a problem that it is difficult to adjust the period of the rectangular wave in increments of a time period shorter than the one clock, since it is considered that the period of the rectangular wave generated by the rectangular-wave-generating circuit is adjusted based on the time period of one clock of a clock in the control portion as a time period unit.

The present invention has been proposed in order to solve the aforementioned problem, and an object of the present invention is to provide an ultrasonic-motor-driving device and an ultrasonic motor unit that allow fine adjustment of the period of driving waves that are generated by a driving-wave-generating portion.

Means for Solving the Problems and Effects of the Invention

An ultrasonic-motor-driving device according to a first aspect of the present invention includes a driving-wave-generating portion that generates signals for driving piezoelectric elements. The piezoelectric elements are included in an ultrasonic motor. The driving-wave-generating portion is constructed capable of generating driving waves including a plurality of driving waves with different periods.

According to the ultrasonic-motor-driving device according to the first aspect of the present invention, since the driving-wave-generating portion is constructed capable of generating driving waves including a plurality of driving waves with different periods as stated above, in the case where the plurality of driving waves with different periods serve as a set of driving waves, it can be considered that the average period of the driving waves becomes the average value of the plurality of driving waves. According to this construction, the period of the driving waves can be adjusted in increments of a time period shorter than the minimum period that can be adjusted by a control portion (e.g., one clock). As a result, it is possible to allow fine adjustment of the period of driving waves generated by the driving-wave-generating portion. Although reduction of the period of a clock of the control portion (increase of frequency) allows fine adjustment of the period of a driving wave that can be generated by a driving-wave-generating portion, a circuit that can operate at a high rate is required, which in turn causes an increase in cost. Contrary to this, in the case where the driving-wave-generating portion is constructed capable of generating driving waves including a plurality of driving waves with different periods as stated above, since even a circuit that can operate at a low rate can provide fine adjustment of the period of driving waves generated by the driving-wave-generating portion, it is possible to suppress the cost increase of the device.

In the ultrasonic-motor-driving device according to the aforementioned first aspect of the present invention, it is preferable that the driving-wave-generating portion be constructed capable of cyclically generating sets of driving waves. Each set of driving waves includes the plurality of driving waves with different periods. According to this construction, it is possible to cyclically generate sets of driving waves each set of which includes the plurality of driving waves with different periods. As a result, the piezoelectric elements of the ultrasonic motor can be continuously driven based on the sets of driving waves each set of which includes the plurality of driving waves with different periods.

In this case, it is preferable that the plurality of driving waves with different periods include first and second driving waves. The second driving wave has a period different from the first driving wave. In addition, the driving-wave-generating portion is constructed capable of cyclically generating sets of driving waves. Each set of driving waves includes one first driving wave and one second driving wave as the first end second driving waves. According to this construction, in the case where each set of driving waves includes the one first driving wave and the one second driving waves, the average period of the set of driving waves becomes the average value of the periods of the first and second driving waves. As a result, even if a control portion cannot operate to generate the driving wave with a period that falls within the range between the periods of the first and second driving waves, the piezoelectric elements of the ultrasonic motor can be driven based on a pseudo-period that is the mean period (average value) of the periods of the first and second driving waves.

In the ultrasonic-motor-driving device where the driving-wave-generating portion is constructed to cyclically generate sets of driving waves each set of which includes the one first driving wave and the one second driving wave, it is preferable that the driving-wave-generating portion be constructed to alternately generate the one first driving wave and the one second driving wave whereby cyclically generating sets of driving waves each set of which includes the one first driving wave and the one second driving wave. According to this construction, as compared to the case where the one first driving wave and the one second driving wave are generated in no particular order, the driving-wave-generating portion can easily operate to generate the driving waves.

In the aforementioned ultrasonic-motor-driving device where the driving-wave-generating portion is constructed capable of cyclically generating sets of driving waves each set of which includes the plurality of driving waves with different periods, it is preferable that the plurality of driving waves with different periods include first and second driving waves. The second driving wave has a period different from the first driving wave. In addition, it is preferable that the driving-wave-generating portion be constructed capable of cyclically generating sets of driving waves each set of which includes one or plurality of first driving waves and one or plurality of second driving waves as the first and second driving waves. According to this construction, for example, in the case where each set of driving waves includes the one first driving wave and the plurality of second driving waves, the average period of the set of driving waves is a period that falls within the range between the periods of the first and second driving waves and is closer to the period of the second driving wave. As a result, even if a control portion cannot operate to generate the driving wave with a period that falls within the range between the periods of the first and second driving waves, it is possible to provide fine adjustment of the pseudo-period of driving waves to even a period other than the average value of the periods of the one first driving wave and the one second driving wave. Therefore, the piezoelectric elements of the ultrasonic motor can be driven based on a period that can be adjusted in finer increments.

In this case, it is preferable that the driving-wave-generating portion be constructed to alternately generate the one or plurality of first driving waves and the one or plurality of second driving waves whereby cyclically generating sets of driving waves each set of which includes the one or plurality of first driving waves and the one or plurality of second driving waves. According to this construction, as compared to the case where the one or plurality of first driving waves and the one or plurality of second driving waves are generated in no particular order, the driving-wave-generating portion can easily operate to generate the driving waves.

In the aforementioned ultrasonic-motor-driving device where the plurality of driving waves with different periods include the first and second driving waves, it is preferable that the plurality of driving waves with different periods include rectangular waves, and that the period of the second driving wave be longer by one clock or an integral multiple of one clock of a clock of the control portion than the period of the first driving wave. According to this construction, in the case where each set of driving waves includes one first driving wave and one second driving wave, the period of the second driving wave is longer by one clock of the clock of the control portion than the period of the first driving wave, for example, the average period of the set of driving waves is a period longer by half the one clock than the period of the first driving wave. As a result, even in the case where the control portion can adjust the period of the driving waves only in increments of a time period of one clock, the period of the driving waves can be adjusted in increments of a time period shorter than the one clock.

In this case, it is preferable that sets of driving waves each set of which includes the first driving wave and the second driving wave be generated so that the period of the driving waves can be adjusted to a period that falls within the range between the periods of the first and second driving waves in increments of a time period shorter than the one clock. According to this construction, for example, as compared to the case where the frequency of clock is changed to allow fine adjustment of the period of the driving wave, it is possible to easily adjust the period of the driving waves in increments of a time period shorter than one clock.

In the aforementioned ultrasonic-motor-driving device where the plurality of driving waves with different periods include rectangular waves, it is preferable that the plurality of driving waves with different periods include rectangular waves, that the period of the second driving wave be longer by one clock of the clock of the control portion than the period of the first driving wave, and that sets of driving waves each set of which includes the one first driving wave and the one second driving wave be generated so that the pseudo-period of the driving waves can be adjusted to a period longer by half the clock than the period of the first driving wave. According to this construction, the period of the driving waves can be easily adjusted by a time period of half the one clock, which is shorter than one clock, by means of the first and second driving waves.

In the aforementioned ultrasonic-motor-driving device where the plurality of driving waves with different periods include rectangular waves, it is preferable that the plurality of driving waves with different periods include rectangular waves, that the period of the second driving wave be longer by one clock of the clock of the control portion than the period of the first driving wave, and that sets of driving waves each set of which includes the one first driving wave and the plurality of second driving waves be generated so that the pseudo-period of the driving waves can be adjusted to a period that falls within the range between the periods of the first and second driving waves and is closer to the period of the second driving wave than the period of the first driving wave. According to this construction, the period of the driving waves can be easily adjusted in increments of a time period shorter than one clock to a period closer to the period of the second driving wave than the period of the first driving wave by means of the first and second driving waves.

In this case, it is preferable that the plurality of driving waves with different periods include rectangular waves, that the period of the second driving wave be longer by one clock of the clock of the control portion than the period of the first driving wave, and that sets of driving waves each set of which includes one first driving wave and two second driving waves as the first and second driving waves be generated so that the pseudo-period of the driving waves can be adjusted to a period longer by two-thirds the clock than the period of the first driving wave. According to this construction, the period of the driving waves can be easily adjusted in increments of a time period of two-thirds the one clock, which is shorter than one clock, by means of the first and second driving waves.

In the aforementioned ultrasonic-motor-driving device where the plurality of driving waves with different periods include rectangular waves, it is preferable that the plurality of driving waves with different periods include rectangular waves, and that the periods of the first and second driving waves be integral multiples of the clock of the control portion. According to this construction, the first and second driving waves can be easily generated based on a clock of a control portion.

In the ultrasonic-motor-driving device according to the aforementioned first aspect of the present invention, it is preferable that the driving-wave-generating portion include a rectangular-wave generator that can generate rectangular waves, and that the rectangular-wave generator be constructed capable of generating the driving waves including a plurality of rectangular driving waves with different periods.

According to this construction, a plurality of rectangular waves with different periods can be easily generated by the rectangular-wave generator.

In this case, it is preferable that the driving-wave-generating portion further include a filter that is provided with a plurality of rectangular waves with different periods generated by the rectangular-wave generator and cuts off a rectangular wave with a frequency not smaller than a predetermined frequency. According to this construction, the rectangular wave can be formed into a substantially sine wave by the filter for cutting off the rectangular wave with a frequency not smaller than a predetermined frequency.

In the ultrasonic-motor-driving device where aforementioned filter is further provided, it is preferable that a plurality of filters be provided as the filter, and that the rectangular-wave generator be constructed to provide the plurality of filters with a plurality of rectangular waves with different periods generated by the rectangular-wave generator at different phases so that the plurality of rectangular waves with different periods, which are provided to the plurality of filters, can be provided from the plurality of filters to the piezoelectric elements. According to this construction, signals to be provided to the piezoelectric elements can be adjusted to a frequency suitable for increasing the rotational speed of the ultrasonic motor by means of the plurality of rectangular waves with different periods. Therefore, it is possible to increase the rotational speed of the ultrasonic motor.

An ultrasonic motor unit according to a second aspect of the present invention includes an ultrasonic motor that includes a piezoelectric element, and a driving device that includes a driving-wave-generating portion for generating signals for driving the piezoelectric elements of the ultrasonic motor. The driving-wave-generating portion is constructed capable of generating driving waves including a plurality of driving waves with different periods.

According to the ultrasonic motor unit according to this second aspect of the present invention, since the driving-wave-generating portion is constructed capable of generating driving waves including a plurality of driving waves with different periods as stated above, in the case where the plurality of driving waves with different periods serve as a set of driving waves, it can be considered that the average period of the driving waves becomes the average value of the plurality of driving waves. According to this construction, the period of the driving waves can be adjusted in increments of a time period shorter than the minimum period that can be adjusted by a control portion (e.g., one clock). As a result, it is possible to allow fine adjustment of the period of driving waves generated by the driving-wave-generating portion. Although reduction of the period of a clock of the control portion (increase of frequency) allows fine adjustment of the period of a driving wave that can be generated by a driving-wave-generating portion, a circuit that can operate at a high rate is required, which in turn causes an increase in cost. Contrary to this, in the case where the driving-wave-generating portion is constructed capable of generating driving waves including a plurality of driving waves with different periods as stated above, since even a circuit that can operate at a low rate can provide fine adjustment of the period of driving waves generated by the driving-wave-generating portion, an ultrasonic motor unit capable of suppressing the cost increase of the device can be constructed.

In the ultrasonic motor unit according to the aforementioned second aspect of the present invention, it is preferable that the driving-wave-generating portion be constructed capable of cyclically generating sets of driving waves. Each set of driving waves includes the plurality of driving waves with different periods. According to this construction, it is possible to cyclically generate sets of driving waves each set of which includes the plurality of driving waves with different periods. As a result, an ultrasonic motor unit can be constructed capable of continuously driving the piezoelectric elements of the ultrasonic motor based on the sets of driving waves each set of which includes the plurality of driving waves with different periods.

In this case, it is preferable that the plurality of driving waves with different periods include first and second driving waves. The second driving wave has a period different from the first driving wave. In addition, it is preferable that the driving-wave-generating portion be constructed capable of cyclically generating sets of driving waves. Each set of driving waves includes one first driving wave and one second driving wave as the first and second driving waves. According to this construction, since each set of driving waves includes the one first driving wave and the one second driving waves, the average period of the set of driving waves becomes the average value of the periods of the first and second driving waves. As a result, even if a control portion cannot operate to generate the driving wave with a period that falls within the range between the periods of the first and second driving waves, an ultrasonic motor unit can be constructed capable of driving the piezoelectric elements of the ultrasonic motor based on a pseudo-period that is the mean (average value) period of the periods of the first and second driving waves.

In the aforementioned ultrasonic motor unit where the driving-wave-generating portion is constructed capable of cyclically generating sets of driving waves each set of which includes the plurality of driving waves with different periods, it is preferable that the plurality of driving waves with different periods include first and second driving waves. The second driving wave has a period different from the first driving wave. In addition, it is preferable that the driving-wave-generating portion be constructed capable of cyclically generating sets of driving waves each set of which includes one or plurality of first driving waves and one or plurality of second driving waves as the first and second driving waves. According to this construction, for example, in the case where each set of driving waves includes the one first driving wave and the plurality of second driving waves, the average period of the set of driving waves is a period that falls within the range between the periods of the first and second driving waves and is closer to the period of the second driving wave. As a result, even if a control portion cannot operate to generate the driving wave with a period that falls within the range between the periods of the first and second driving waves, it is possible to provide fine adjustment of the pseudo-period of driving waves to even a period other than the average value of the periods of the first and second driving waves. Therefore, an ultrasonic motor unit can be constructed capable of driving the piezoelectric elements of the ultrasonic motor based on a period that can be adjusted in finer increments.

In the aforementioned ultrasonic motor unit where the plurality of driving waves with different periods include the first and second driving waves, it is preferable that the plurality of driving waves with different periods include rectangular waves, and that the period of the second driving wave be longer by one clock or an integral multiple of one clock of a clock of the control portion than the period of the first driving wave. According to this construction, in the case where each set of driving waves includes one first driving wave and one second driving wave, the period of the second driving wave is longer by one clock of the clock of the control portion than the period of the first driving wave, for example, the average period of the set of driving waves is a period longer by half the one clock than the period of the first driving wave. As a result, even in the case where the control portion can adjust the period of the driving waves only in increments of one clock, an ultrasonic motor unit can be constructed capable of adjusting the period of the driving waves in increments of a time period shorter than the one clock.

MODES FOR CARRYING OUT THE INVENTION

The following description will describe embodiments according to the present invention with reference to the drawings.

First Embodiment

A driving device 2 for an ultrasonic motor 1 according to a first embodiment of the present invention is described with reference to FIG. 1.

Figure 1:
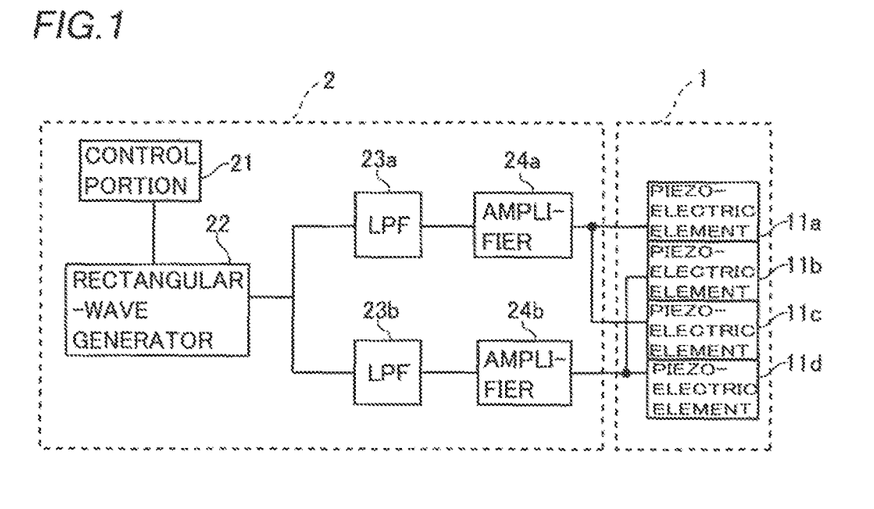
FIG. 1 A block diagram of an ultrasonic-motor-driving device according to a first embodiment of the present invention.

As shown in FIG. 1, the driving device 2 is connected to the ultrasonic motor 1. The driving device 2 includes a control portion 21, a rectangular-wave generator 22, low pass filters (LPF) 23a and 23b, and amplifiers 24a and 24b. The rectangular-wave generator 22, the LPF 23a and 23b, and the amplifiers 24a and 24b are an exemplary "driving-wave-generating portion" in the present invention. The low pass filters (LPF) 23a and 23b are exemplary "filters" in the present invention.

The control portion 21 is connected to the rectangular-wave generator 22. The control portion 21 is constructed to control rectangular waves that are generated by the rectangular-wave generator 22. Also, the rectangular-wave generator 22 is connected to the LPFs 23a and 23b. The rectangular-wave generator 22 serves to generate rectangular waves (voltages), and to provide the rectangular waves at different phases to the LPFs 23a and 23b. In the first embodiment, the rectangular-wave generator 22 is constructed capable of generating the driving waves including a plurality of driving waves with different periods. In addition, the rectangular-wave generator 22 is constructed capable of cyclically generating sets of rectangular waves. Each set of rectangular waves includes the plurality of rectangular waves with different periods.

The LPFs 23a and 23b are connected to the amplifiers 24a and 24b, respectively. Also, the LPFs 23a and 23b have the function of cutting off a rectangular wave with a frequency not smaller than a predetermined frequency. In addition, rectangular waves that are inputted to the LPFs 23a and 23b are provided as substantially sine waves. The substantially sine waves (voltages) that are provided from the LPF 23a and 23b are provided to the amplifiers 24a and 24b, respectively. The amplifiers 24a and 24b amplify and output the substantially sine waves. A voltage that is amplified by the amplifier 24a (e.g., wave of cos (t)) is provided to a piezoelectric element 11a of the ultrasonic motor 1, while an inverted voltage (wave of −cos (t)) that is obtained by inverting the voltage provided to the piezoelectric element 11a in positive/negative polarity is provided to a piezoelectric element 11c. A voltage that is amplified by the amplifier 24b (wave of sin (t)) is provided to a piezoelectric element 11b, while an inverted voltage (wave of −sin (t)) that is obtained by inverting the voltage provided to the piezoelectric element 11b in positive/negative polarity is provided to a piezoelectric element 11d.

The rectangular waves generated by the rectangular-wave generator 22 according to the first embodiment are now described with reference to FIG. 2.

Figure 2:
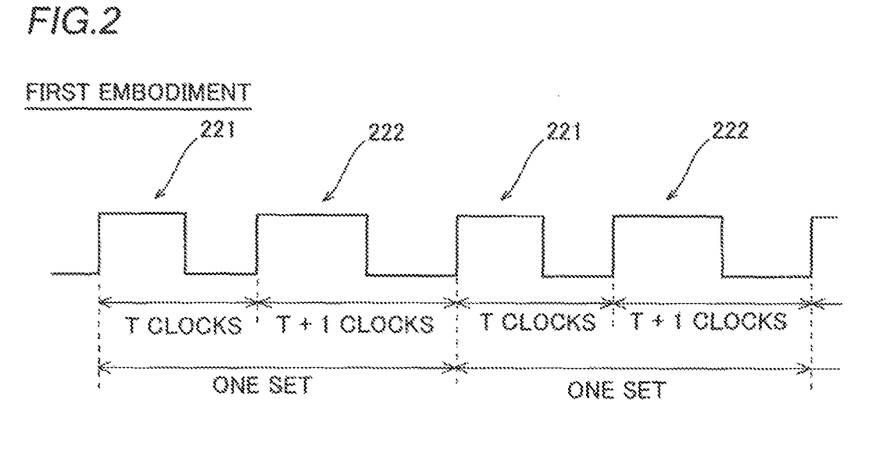
FIG. 2 A wave chart of rectangular waves generated by a rectangular-wave generator of the ultrasonic-motor-driving device according to the first embodiment of the present invention.

As shown in FIG. 2, according to the first embodiment, the rectangular-wave generator 22 alternately generates rectangular waves 221 and 222 that have a period of T clocks (T is a natural number) and a period of (T+1) clocks of a clock of the control portion 21, respectively. That is, the rectangular-wave generator 22 cyclically generates sets of rectangular waves. Each set of rectangular waves includes the rectangular wave 221 with a period of T clocks and the rectangular wave 222 with a period of (T+1) clocks. Thus, in the case where each set of rectangular waves includes the rectangular wave 221 with a period of T clocks and the rectangular wave 222 with a period of (T+1) clocks, the average period of the rectangular waves can be (T+½) clocks. The rectangular wave 221 is an exemplary "first driving wave" in the present invention. The rectangular wave 222 is an exemplary "second driving wave" in the present invention.

Figure 3:
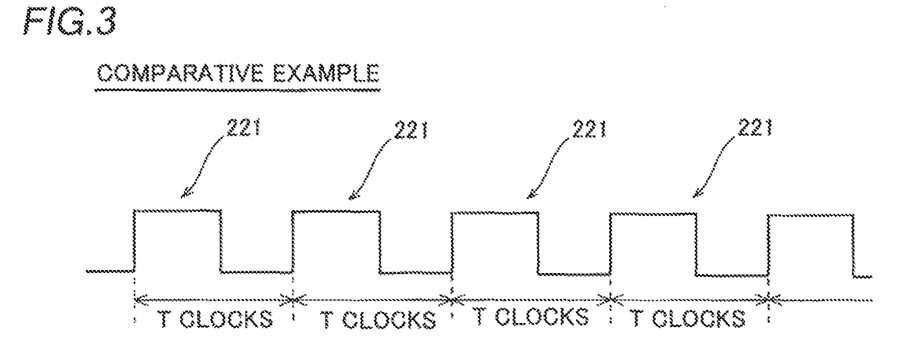
FIG. 3 A wave chart of rectangular waves generated by a rectangular-wave generator of an ultrasonic-motor-driving device according to a comparative example.
Figure 4:
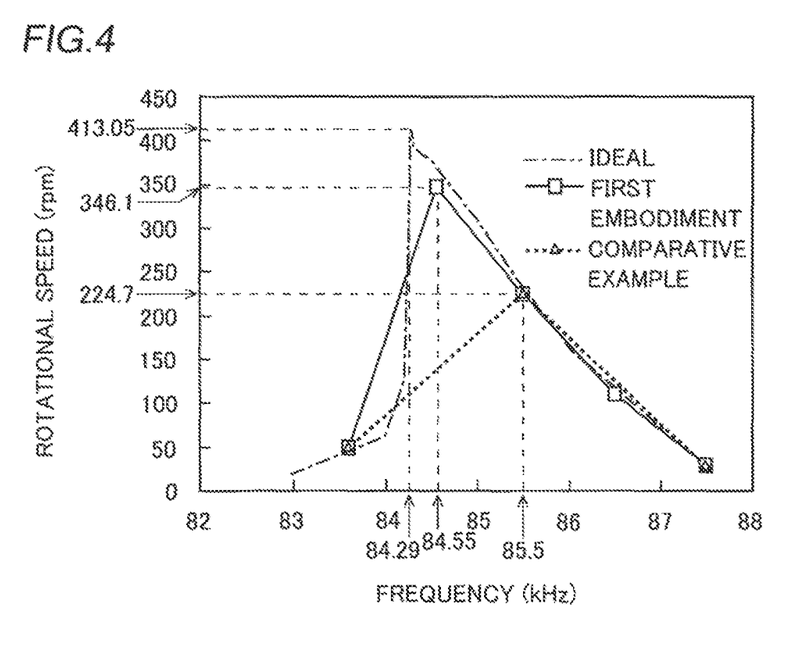
FIG. 4 A graph showing the result of simulation that is performed to obtain the relation between the rotational speed of ultrasonic motor and frequency.

A simulation that is performed to obtain relation between the rotational speed of ultrasonic motor and frequency is now described with reference to FIGS. 3 and 4. A rectangular-wave generator 22 according to a comparative example is constructed to constantly generate rectangular waves 221 with a time period of T clocks of the clock of the control portion 21 as shown in FIG. 3. The simulation is performed to obtain relation between the rotational speed of ultrasonic motor 1 and frequency, which is the reciprocal of the period (1/period).

The simulation is performed in an ideal case where the frequency of voltages to be applied to the piezoelectric elements 11a to 11d of the ultrasonic motor 1 can be adjusted in very fine increments. According to the result, as shown by the single-dot-dashed line of FIG. 4, the rotational speed of the ultrasonic motor 1 gradually increases from a frequency of 83 kHz, and then sharply increases after 84 kHz. After that, the rotational speed reaches the maximum (413.05 rpm) at frequency of 84.29 kHz. After that, the rotational speed gradually decreases with increase in frequency.

A simulation is performed in the case where the rectangular-wave generator 22 generates rectangular waves with a single period (frequency) as shown in the comparative example of FIG. 3. In this case, the control portion 21 can adjust the frequency to three values of 83.6, 85.5, and 87.5 kHz. According to the result, as shown by the dotted line (triangles) in FIG. 4, the maximum rotational speed (224.7 rpm) is obtained at frequency of 85.5 kHz. Dissimilar to the aforementioned ideal case (single-dot-dashed line in FIG. 4), the control portion 21 cannot adjust the frequency to 84.29 kHz, which is the frequency capable of providing the maximum rotational speed (413.05 rpm). For this reason, the maximum rotational speed in the comparative example is approximately 54.4% of the ideal case (=224.7/413.05×100).

A simulation is performed in the case where the rectangular-wave generator 22 generates rectangular waves with a plurality of periods as shown in FIG. 2 (first embodiment). That is, a plurality of rectangular waves with different frequencies are provided from the rectangular-wave generator 22. In the first embodiment case, the control portion 21 can adjust the frequency to three values of 83.6, 85.5, and 87.5 kHz similar to the foregoing comparative example. In addition, the simulation is performed in the case where rectangular waves with frequencies of 83.6 and 85.5 kHz are alternately generated (rectangular waves with an average frequency of 84.55 kHz), and the case where rectangular waves with frequencies of 85.5 and 87.5 kHz are alternately generated (rectangular waves with an average frequency of 86.5 kHz). According to the result, as shown by the solid line (squares) in FIG. 4, the maximum rotational speed (346.1 rpm) is obtained at the average frequency of 84.55 kHz. According to the first embodiment, the rectangular-wave generator 22 alternately generates rectangular waves with two different periods (frequencies). For this reason, the average frequency can be adjusted to a value in proximity to 84.29 kHz, which is the frequency capable of providing the maximum rotational speed (413.05 rpm) in the aforementioned ideal case (single-dot-dashed line in FIG. 4). Thus, the maximum rotational speed in the first embodiment is approximately 83.8% of the ideal case (=346.1/413.05×100).

According to the first embodiment of the present invention, since the rectangular-wave generator 22 is constructed capable of generating rectangular waves including a plurality of rectangular waves with different periods (rectangular waves 221 and 222) as discussed above, in the case where the plurality of rectangular waves with different periods serve as a set of rectangular waves, it can be considered that the average period of the rectangular waves becomes the average value of the plurality of rectangular waves. According to this construction, the periods of the rectangular waves can be adjusted in increments of a time period shorter than the minimum period that can be adjusted by the control portion 21 (e.g., one clock). As a result, it is possible to allow fine adjustment of the periods of rectangular waves generated by the rectangular-wave generator 22. Although reduction of the period of a clock of the control portion 21 (increase of frequency) allows fine adjustment of the period of a rectangular wave that can be generated by a rectangular-wave generator 22, a circuit that can operate at a high rate is required, which in turn causes an increase in cost. Contrary to this, in the case where the rectangular-wave generator 22 is constructed capable of generating rectangular waves including a plurality of rectangular waves with different periods as stated above, since even a circuit that can operate at a low rate can provide fine adjustment of the period of rectangular waves generated by the rectangular-wave generator 22, it is possible to suppress the cost increase of the device.

In addition, in the first embodiment, as discussed above, the rectangular-wave generator 22 is constructed capable of cyclically generating sets of rectangular waves. Each set of rectangular waves includes the plurality of rectangular waves with different periods (rectangular waves 221 and 222). Accordingly, sets of rectangular waves each set of which includes the plurality of rectangular waves with different periods are cyclically generated. As a result, the piezoelectric elements 11a to 11d of the ultrasonic motor 1 can be continuously driven based on sets of rectangular waves each set of which includes the plurality of rectangular waves with different periods.

Also, in the first embodiment, as discussed above, the plurality of rectangular waves with different periods include the rectangular wave 221 and the rectangular wave 222 with a period different from the rectangular wave 221. In addition, the rectangular-wave generator 22 is constructed capable of cyclically generating sets of rectangular waves each set of which includes one rectangular wave 221 and one rectangular wave 222. Thus, in the case where each set of rectangular waves includes one rectangular wave 221 and one rectangular wave 222, the average period of the rectangular waves becomes the average value (T+½ clocks) of the period (T clocks) of the rectangular wave 221 and the period ((T+1) clocks) of the rectangular wave 222. As a result, even if the control portion 21 cannot operate to generate a rectangular wave with a period that falls within the range between the periods of the rectangular waves 221 and 222, the piezoelectric elements 11a to 11d of the ultrasonic motor 1 can be driven based on a pseudo-period that is the mean (average value) period of the periods of the rectangular waves 221 and 222.

Also, in the first embodiment, as discussed above, the rectangular-wave generator 22 is constructed to alternately generate one rectangular wave 221 and one rectangular wave 222 whereby cyclically generating sets of driving wave each set of which includes one rectangular wave 221 and one rectangular wave 222. According to this construction, as compared to the case where one rectangular wave 221 and one rectangular wave 222 are generated in no particular order, the rectangular-wave generator 22 can easily operate to generate the rectangular waves.

Also, in the first embodiment, as discussed above, since the period of the rectangular wave 222 is longer by one clock of the clock of the control portion 21 than the period of the rectangular wave 221, in the case where each set of rectangular waves includes one rectangular wave 221 and one rectangular wave 222, the average period of the rectangular waves becomes a period longer by half the clock than the rectangular wave 221. As a result, even in the case where the control portion 21 can adjust the periods of the rectangular waves only in increments of a time period of one clock, the period of the rectangular waves can be adjusted in increments of a time period shorter than the one clock.

Also, in the first embodiment, as discussed above, sets of rectangular waves each set of which includes the rectangular waves 221 and 222 are cyclically generated so that the period of the rectangular waves can be adjusted to a period that falls within the range between the periods of the rectangular driving waves 221 and 222 in increments of a time period shorter than the one clock. According to this construction, for example, as compared to the case where the frequency of clock is changed to allow fine adjustment of the period of the rectangular wave, it is possible to easily adjust the period of the rectangular waves in increments of a time period shorter than one clock.

Also, in the first embodiment, as discussed above, the periods of the rectangular waves 221 and 222 are integral multiples of the clock (T times, and (T+1) times) of the control portion 21. According to this construction, the rectangular waves 221 and 222 can be easily generated based on the clock of the control portion 21.

Also, in the first embodiment, as discussed above, the LPFs 23a and 23b are provided to receive the rectangular waves 221 and 222, which are generated by the rectangular-wave generator 22, and to cut off a rectangular wave with a frequency not smaller than a predetermined frequency. According to this construction, the rectangular waves 221 and 222 can be converted into substantially sine waves by the LPFs 23a and 23b, respectively.

Also, in the first embodiment, as discussed above, the rectangular-wave generator 22 is constructed to provide the LPFs 23a and 23b with the rectangular waves 221 and 222 having different periods, which are generated by the rectangular-wave generator 22, at different phases so that the rectangular waves 221 and 222, which are provided to the LPFs 23a and 23b, are outputted from the LPF 23a (LPF 23b) to the piezoelectric elements 11a and 11C (11b and 11d). According to this construction, signals to be provided to the piezoelectric elements 11a to 11d can be adjusted to a frequency suitable for increasing the rotational speed of the ultrasonic motor 1 by means of the rectangular waves 221 and 222 with different periods. Therefore, it is possible to increase the rotational speed of the ultrasonic motor 1.

Second Embodiment

A second embodiment is now described with reference to FIG. 5. Although the aforementioned one rectangular wave 221 and one rectangular wave 222 are alternately generated in the first embodiment, sets of rectangular waves each set of which includes a plurality of rectangular waves 222 and one rectangular wave 221 are generated in the second embodiment.

Figure 5:
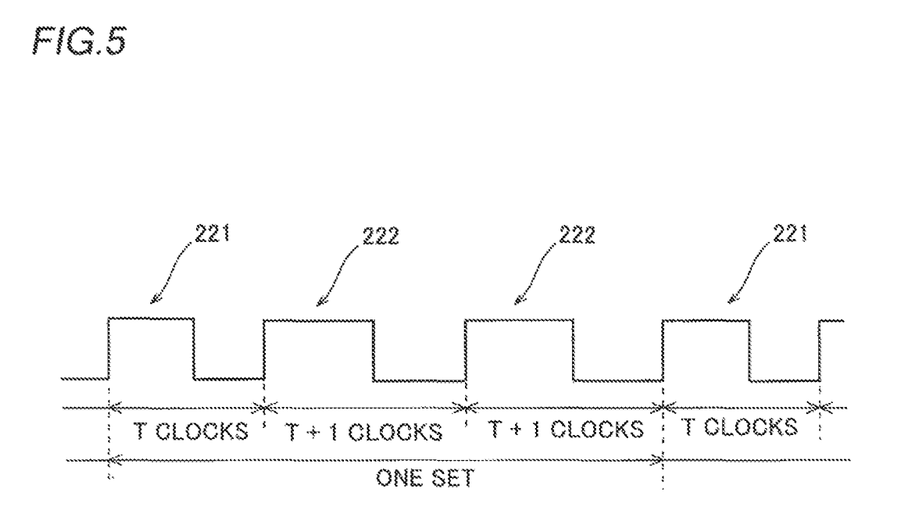
FIG. 5 A wave chart of waves generated by an ultrasonic-motor-driving device according to a second embodiment of the present invention.

As shown in FIG. 5, the rectangular-wave generator 22 is constructed to generate sets of rectangular waves each set of which includes a plurality (two in FIG. 5) of rectangular waves 222 and one rectangular wave 221 in the second embodiment. In addition, the rectangular-wave generator 22 is constructed to cyclically generate sets of rectangular waves each set of which includes a plurality (two in FIG. 5) of rectangular waves 222 and one rectangular wave 221. As shown in FIG. 5, in the case where each set of rectangular waves includes one rectangular wave 221 with a period of T clocks and two rectangular waves 222 with a period of (T+1) clocks, the average period of the rectangular waves becomes (T+⅔) clocks. That is, in the case where each set of rectangular waves includes one rectangular wave 221 with a period of T clocks and two rectangular waves 222 with a period of (T+1) clocks, the average period of the rectangular waves becomes a period close to the period of the rectangular wave 222. In other words, the average period becomes a period close to one of the rectangular waves the number of which is greater than another rectangular wave during generation in each set of rectangular waves.

Figure 6:
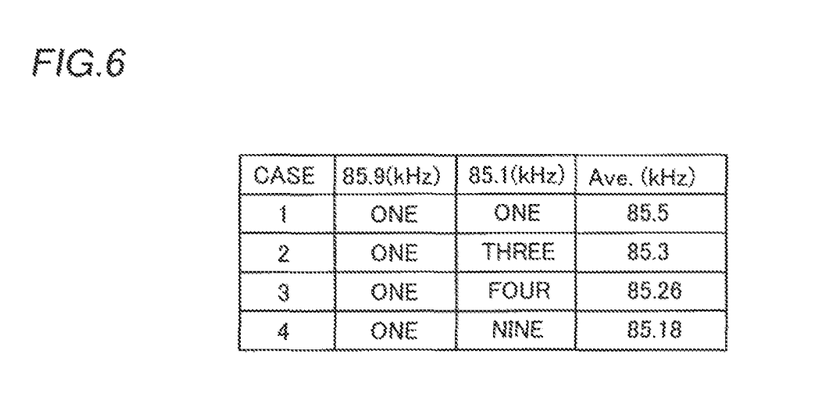
FIG. 6 A table showing the conditions of the rectangular waves generated by the rectangular-wave generator in the simulation that is performed to obtain the relation between the rotational speed of ultrasonic motor and frequency.
Figure 7:
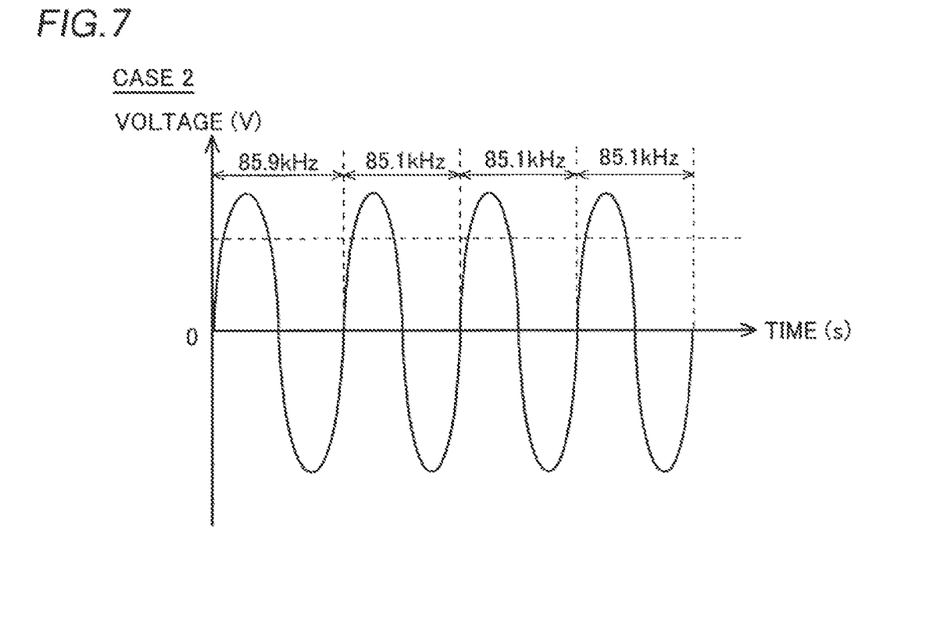
FIG. 7 A chart showing the sine wave provided from LPF in the case 3 shown in FIG. 6.
Figure 8:
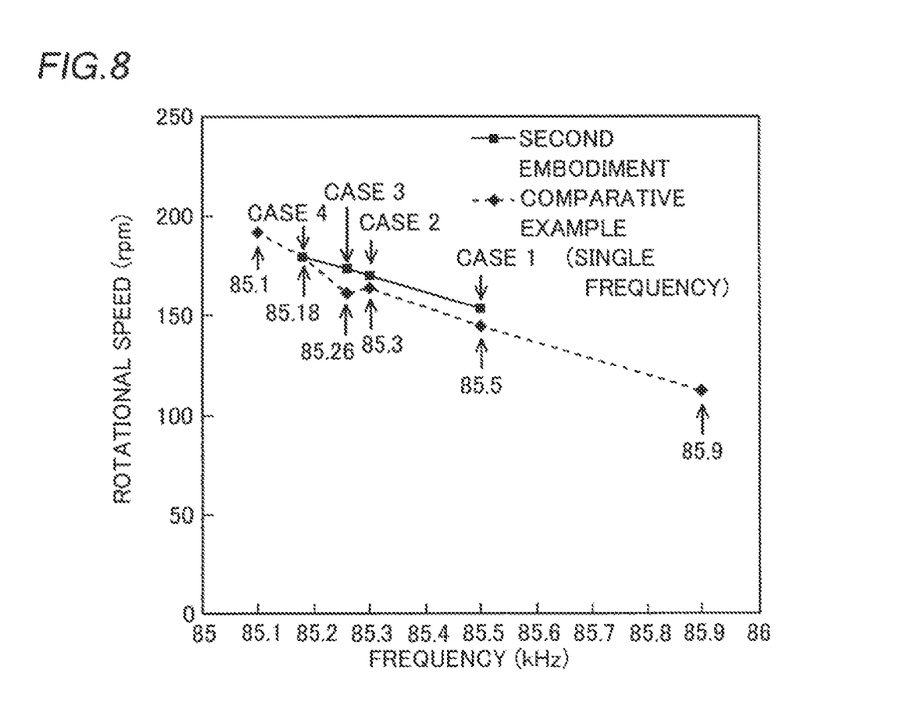
FIG. 8 A graph showing the result of simulation that is performed to obtain relation between the rotational speed of ultrasonic motor and frequency in the case where rectangular waves are applied to the ultrasonic motor under the conditions shown in FIG. 6.

A simulation that is performed to obtain relation between the rotational speed of ultrasonic motor 1 and frequency is now described in the case where the number of the rectangular waves 222 is varied with reference to FIGS. 6 to 8.

Adjustment of the waveforms of voltages (rectangular waves) for driving the piezoelectric elements 11a to 11d of the ultrasonic motor 1 are first described. As shown in FIG. 6, in a case 1, the rectangular-wave generator 22 alternately generates one rectangular wave with a frequency of 85.9 kHz, and one rectangular wave with a frequency of 85.1 kHz. That is, the average value of the frequencies of the rectangular waves becomes 85.5 kHz in the case 1. In a case 2, the rectangular-wave generator 22 generates one rectangular wave with a frequency of 85.9 kHz, and then generates three rectangular waves with a frequency of 85.1 kHz. That is, the average value of the frequencies of the rectangular waves becomes 85.3 kHz in the case 2. In a case 3, the rectangular-wave generator 22 generates one rectangular wave with a frequency of 85.9 kHz, and then generates four rectangular waves with a frequency of 85.1 kHz. That is, the average value of the frequencies of the rectangular waves becomes 85.26 kHz in the case 3. In a case 4, the rectangular-wave generator 22 generates one rectangular wave with a frequency of 85.9 kHz, and then generates nine rectangular waves with a frequency of 85.1 kHz. That is, the average value of the frequencies of the rectangular waves becomes 85.18 kHz in the case 4. As shown in FIG. 6, the average value of the frequencies of the rectangular waves becomes closer to 85.1 kHz as the number of generated rectangular waves with 85.1 kHz increases.

As shown in FIG. 7, in the case 2, sets of voltages each set of which includes one voltage with a frequency of 85.9 kHz and three voltages with a frequency of 85.1 kHz are applied to the piezoelectric elements 11a to 11d of the ultrasonic motor 1 (see FIG. 1). FIG. 7 shows the waves after the rectangular waves are converted into the substantially sine waves by the LPFs 23a and 23b.

A simulation is performed so that the piezoelectric elements 11a to 11d of the ultrasonic motor 1 are driven by means of the rectangular waves (voltages) that are generated in each of the foregoing cases 1 to 4. Also, a simulation is performed so that the piezoelectric elements 11a to 11d of the ultrasonic motor 1 are driven by means of the voltages that have a single frequency in each of cases as a comparative example. The single frequency (period) is selected from 85.1, 85.18, 85.26, 85.3, 85.5, and 85.9 kHz, in each case. According to the result, as shown by the solid line (squares) in FIG. 8, it is confirmed that the rotational speed of the ultrasonic motor 1 gradually decreases in the order of the cases 4, 3, 2, and 1 as the average value of frequencies decreases. According to the comparison between the rotational speeds in the case where a plurality of rectangular waves with different periods (frequencies) are generated by the rectangular-wave generator 22 (solid line (squares) in FIG. 8) and the case where rectangular waves with a single period (frequency) are generated by the rectangular-wave generator 22 (dotted line (diamonds) in FIG. 8), although the rotational speed is slightly higher in the case where a plurality of rectangular waves with different periods (frequencies) are generated by the rectangular-wave generator 22 (solid line (squares) in FIG. 8), it is confirmed that the rotational speeds in the both cases substantially agree with each other. That is, it is confirmed that, in the case a plurality of rectangular waves with different periods (frequencies) are combined and the case where rectangular waves with a single period are generated, the rotational speeds agree with each other.

In the second embodiment, as discussed above, the plurality of rectangular waves with different periods include the rectangular wave 221 and the rectangular wave 222 with a period different from the rectangular wave 221. In addition, the rectangular-wave generator 22 is constructed capable of cyclically generating sets of rectangular waves each set of which includes one rectangular wave 221 and a plurality of rectangular waves 222. Thus, in the case where a plurality of rectangular waves 222 and one rectangular wave 221 serve as a set of rectangular waves, the average period of the rectangular waves becomes a period that falls within the range between the periods of the rectangular waves 221 and 222 and is closer to the period of the rectangular wave 222. As a result, even if the control portion 21 cannot operate to generate a rectangular wave with a period that falls within the range between the periods of the rectangular waves 221 and 222, the pseudo-period can be adjusted in fine increments to a period other than the average value of the periods of the rectangular waves 221 and 222. Therefore, the piezoelectric elements 11a to 11d of the ultrasonic motor 1 can be driven based on a period that can be adjusted in finer increments.

Also, in the second embodiment, as discussed above, the rectangular-wave generator 22 is constructed to alternately generate one rectangular wave 221 and a plurality of (two) rectangular waves 222 whereby cyclically generating sets of driving waves, each set of which includes one rectangular wave 221 and the plurality of (two) rectangular waves 222. According to this construction, as compared to the case where one rectangular wave 221 and a plurality of (two) rectangular waves 222 are generated in no particular order, the rectangular-wave generator 22 can easily operate to generate the rectangular waves.

In addition, the other effects in the second embodiment are similar to the foregoing first embodiment.

It should be appreciated, however, that the embodiments described above are illustrative in all points, and not restrictive. The invention is defined not by the above description of the embodiment, but by the appended claims, their equivalents, and various modifications that can be made without departing from the scope of the invention as defined in the appended claims.

For example, although the foregoing first and second embodiments have been illustratively described that, after the rectangular-wave generator generates the rectangular waves, the rectangular waves are converted into substantially sine waves by the LPFs, the present invention is not limited to this. For example, the ultrasonic-motor-driving device may directly generate sine waves (cosine waves) without generating rectangular waves.

Also, although the foregoing first and second embodiments have been illustratively described that two rectangular waves with different periods generated by the rectangular-wave generator have periods (T clocks, and (T+1) clocks) the difference of which is one clock, the present invention is not limited to this. For example, two rectangular waves with different periods generated by the rectangular-wave generator may have periods the difference of which is two or more clocks.

Also, although the foregoing first and second embodiments have been illustratively described that two rectangular waves with different periods are generated, the present invention is not limited to this. In the present invention, three or more rectangular waves with different periods may be generated.

Also, although the foregoing first and second embodiments have been illustratively described that sets of rectangular waves each set of which includes a plurality of rectangular waves with different periods are cyclically generated, the present invention is not limited to this. A plurality of rectangular waves with different periods may be generated not in sets of rectangular waves each set of which includes the plurality of rectangular waves, in other words, a plurality of rectangular waves with different periods may be generated in no particular order.

Also, although the foregoing second embodiment has been illustratively described that sets of rectangular waves each set of which includes one rectangular wave with a period of T clocks and a plurality of rectangular waves with a period of (T+1) clocks are generated, the present invention is not limited to this. In the present invention, a plurality of rectangular waves with a period of T clocks and one rectangular wave with a period of (T+1) clocks may be generated. That is, rectangular waves to be generated as a plurality of rectangular waves can be rectangular waves with a shorter period or rectangular waves with a longer period. Also, in the present invention, a plurality of rectangular waves with a period of T clocks and a plurality of rectangular waves with a period of (T+1) clocks may be generated.

The invention claimed is:

1. An ultrasonic-motor-driving device comprising:
a driving-wave-generating portion that generates signals for driving piezoelectric elements, the piezoelectric elements being included in an ultrasonic motor, wherein
the driving-wave-generating portion is constructed capable of generating driving waves including a plurality of driving waves with different periods, and
the driving-wave-generating portion is constructed capable of cyclically generating sets of driving waves each set of which includes the plurality of driving waves with different periods, the plurality of driving waves with different periods include first and second driving waves, the second driving wave has a period different from the first driving wave, and the period of the second driving wave is longer by one clock or an integral multiple of one clock of a clock of a control portion than the period of the first driving wave.

2. The ultrasonic-motor-driving device according to claim 1, wherein
the driving-wave-generating portion is constructed capable of cyclically generating sets of driving waves each set of which includes the plurality of driving waves with different periods.

3. The ultrasonic-motor-driving device according to claim 2, wherein
the plurality of driving waves with different periods include first and second driving waves, the second driving wave having a period different from the first driving wave, wherein
the driving-wave-generating portion is constructed capable of cyclically generating sets of driving waves each set of which includes one first driving wave and one second driving wave as the first and second driving waves.

4. The ultrasonic-motor-driving device according to claim 3, wherein
the driving-wave-generating portion is constructed to alternately generate the one first driving wave and the one second driving wave whereby cyclically generating sets of driving waves each set of which includes the one first driving wave and the one second driving wave.

5. The ultrasonic-motor-driving device according to claim 2, wherein
the plurality of driving waves with different periods include first and second driving waves, the second driving wave having a period different from the first driving wave, wherein
the driving-wave-generating portion is constructed capable of cyclically generating sets of driving waves each set of which includes one or plurality of first driving waves and one or plurality of second driving waves as the first and second driving waves.

6. The ultrasonic-motor-driving device according to claim 5, wherein
the driving-wave-generating portion is constructed to alternately generate the one or plurality of first driving waves and the one or plurality of second driving waves whereby cyclically generating sets of driving waves each set of which includes the one or plurality of first driving waves and the one or plurality of second driving waves.

7. The ultrasonic-motor-driving device according to claim 3, wherein
the plurality of driving waves with different periods include rectangular waves, wherein the period of the second driving wave is longer by one clock or an integral multiple of one clock of a clock of a control portion than the period of the first driving wave.

8. The ultrasonic-motor-driving device according to claim 7, wherein
sets of driving waves each set of which includes the first driving wave and the second driving wave are generated so that the period of the driving waves can be adjusted to a period that falls within the range between the periods of the first and second driving waves in increments of a time period shorter than the one clock.

9. The ultrasonic-motor-driving device according to claim 7, wherein
the plurality of driving waves with different periods include rectangular waves, wherein the period of the second driving wave is longer by one clock of the clock of the control portion than the period of the first driving wave, wherein
sets of driving waves each set of which includes the one first driving wave and the one second driving wave are generated so that the pseudo-period of the driving waves can be adjusted to a period longer by half the clock than the period of the first driving wave.

10. The ultrasonic-motor-driving device according to claim 7, wherein
the plurality of driving waves with different periods include rectangular waves, wherein the period of the second driving wave is longer by one clock of the clock of the control portion than the period of the first driving wave, wherein
sets of driving waves each set of which includes the one first driving wave and the plurality of second driving waves are generated so that the pseudo-period of the driving waves can be adjusted to a period that falls within the range between the periods of the first and second driving waves and is closer to the period of the second driving wave than the period of the first driving wave.

11. The ultrasonic-motor-driving device according to claim 10, wherein
the plurality of driving waves with different periods include rectangular waves, wherein the period of the second driving wave is longer by one clock of the clock of the control portion than the period of the first driving wave, wherein
sets of driving waves each set of which includes one first driving wave and two second driving waves as the first and second driving waves are generated so that the pseudo-period of the driving waves can be adjusted to a period longer by two-thirds the clock than the period of the first driving wave.

12. The ultrasonic-motor-driving device according to claim 7, wherein
the plurality of driving waves with different periods include rectangular waves, wherein the periods of the first and second driving waves are integral multiples of the clock of the control portion.

13. The ultrasonic-motor-driving device according to claim 1, wherein
the driving-wave-generating portion includes a rectangular-wave generator that can generate rectangular waves, wherein
the rectangular-wave generator is constructed capable of generating the driving waves including a plurality of rectangular driving waves with different periods.

14. The ultrasonic-motor-driving device according to claim 13, wherein
the driving-wave-generating portion further includes a filter that is provided with a plurality of rectangular waves with different periods generated by the rectangular-wave generator and cuts off a rectangular wave with a frequency not smaller than a predetermined frequency.

15. The ultrasonic-motor-driving device according to claim 14, wherein
a plurality of filters are provided as the filter, wherein
the rectangular-wave generator is constructed to provide the plurality of filters with a plurality of rectangular waves with different periods generated by the rectangular-wave generator at different phases so that the plurality of rectangular waves with different periods, which are provided to the plurality of filters, can be outputted from the plurality of filters to the piezoelectric elements.

16. An ultrasonic motor unit comprising:
an ultrasonic motor that includes piezoelectric elements; and
a driving device that includes a driving-wave-generating portion for generating signals for driving the piezoelectric elements of the ultrasonic motor, the driving-wave-generating portion being constructed capable of generating driving waves including a plurality of driving waves with different periods, and
the driving-wave-generating portion is constructed capable of cyclically generating sets of driving waves each set of which includes the plurality of driving waves with different periods, the plurality of driving waves with different periods include first and second driving waves, the second driving wave has a period different from the first driving wave, and the period of the second driving wave is longer by one clock or an integral multiple of one clock of a clock of a control portion than the period of the first driving wave.

17. The ultrasonic motor unit according to claim 16, wherein
the driving-wave-generating portion is constructed capable of cyclically generating sets of driving waves each set of which includes the plurality of driving waves with different periods.

18. The ultrasonic motor unit according to claim 17, wherein
the plurality of driving waves with different periods include first and second driving waves, the second driving wave having a period different from the first driving wave, wherein
the driving-wave-generating portion is constructed capable of cyclically generating sets of driving waves each set of which includes one first driving wave and one second driving wave as the first and second driving waves.

19. The ultrasonic motor unit according to claim 17, wherein
the plurality of driving waves with different periods include first and second driving waves, the second driving wave having a period different from the first driving wave, wherein
the driving-wave-generating portion is constructed capable of cyclically generating sets of driving waves each set of which includes one or plurality of first driving waves and one or plurality of second driving waves as the first and second driving waves.

20. The ultrasonic motor unit according to claim 18, wherein the plurality of driving waves with different periods include rectangular waves, wherein the period of the second driving wave is longer by one clock or an integral multiple of one clock of a clock of the control portion than the period of the first driving wave.

* * * * *